(12) United States Patent
Chang et al.

(10) Patent No.: US 7,373,617 B2
(45) Date of Patent: May 13, 2008

(54) CHIP DESIGN-IN AID APPARATUS AND METHOD THEREOF

(75) Inventors: Hui-Huang Chang, Shangshan Village (TW); Hsin-Ying Ou, Kaohsiung (TW); Liang-Ji Lin, Ruijing Village (TW); Wei-Chung Shih, Yuanlin Township, Changhua County (TW)

(73) Assignee: Realtek Semiconductor Corp., Hsinchu (TW)

( * ) Notice: Subject to any disclaimer, the term of this patent is extended or adjusted under 35 U.S.C. 154(b) by 432 days.

(21) Appl. No.: 10/950,037

(22) Filed: Sep. 24, 2004

(65) Prior Publication Data

US 2005/0081174 A1  Apr. 14, 2005

(30) Foreign Application Priority Data

Oct. 9, 2003   (TW) .............................. 92128031 A

(51) Int. Cl.
*G06F 17/50*   (2006.01)
(52) U.S. Cl. .......................................................... 716/3
(58) Field of Classification Search ...................... 716/3
See application file for complete search history.

(56) References Cited

U.S. PATENT DOCUMENTS 5,915,103 A * 6/1999 Chambers et al. .......... 710/313
5,966,219 A * 10/1999 Mori .......................... 358/442
6,118,938 A * 9/2000 Lawman et al. .............. 716/16

FOREIGN PATENT DOCUMENTS

WO   WO0195238 A2 * 12/2001

* cited by examiner

*Primary Examiner*—Thuan V. Do
*Assistant Examiner*—Brandon Bowers
(74) *Attorney, Agent, or Firm*—Thomas, Kayden, Horstemeyer & Risley

(57) ABSTRACT

A chip design-in aid system, wherein the chip has a plurality of chip controlling registers for storing at least one parameter. The system includes a user interface for inputting user setting data, the user setting data corresponding to at least one function of the chip; a data processing unit for processing the user setting data; and a parameter adjusting unit for receiving the processed user setting data from the data processing unit, and transmitting the processed user setting data to the chip, so as to adjust the parameter stored in the chip controlling registers, whereby the chip is set to perform the function corresponding to the user setting data.

20 Claims, 7 Drawing Sheets

CHIP DESIGN-IN AID APPARATUS AND METHOD THEREOF

This application claims the benefit of Taiwan application Serial No. 092128031, filed Oct. 9, 2003, the subject matter of which is incorporated herein by reference.

BACKGROUND OF THE INVENTION

1. Field of the Invention

The invention relates in general to a chip design-in aid apparatus, and more particularly to an IC chip design-in aid apparatus and method for simplifying design complexity and accelerating develop process.

2. Description of the Related Art

Electronic products are usually composed of by incorporating components from a number of different vendors. Take multiple function peripherals (MFP) as an example, controller chips of MFP are provided by IC design vendors to MFP manufacturers, and then the manufacturers combine the controller chip with other components provided by respective suppliers to render a marketable MFP product. For every manufacturer, specifications and functions of components provided by different suppliers vary significantly. As a result, controller chips provided by IC vendors are expected to have high tolerance and high compatibility to such variation. By adjusting corresponding circuit parameters, the controller chips are able to fit with components provided by specific suppliers, and accommodate certain requirement of specific manufacturer towards the product.

Besides of providing the hardware controller chips to the manufacturers, IC vendors also need to provide user manuals detailing each and every adjustable setting parameter together with respective functionalities thereof. Engineers of the manufacturer is then able to set and adjust corresponding parameters by programming firmware codes, so as to make sure that the operations of the controller chip properly address the requirements of the manufacturer to the functions of the product. However, there are usually so many adjustable parameters in a controller chip, that the effects imposed on the functions of the product by such adjustment may grow more complicated than ever. As a result, the engineers of the manufacturer are forced to spend enormous amount of time studying the user manual, and engaging in redundant trial-and-error testing process, in order to gain knowledge on the influence of respective parameter to the system, and thereby gain control of it. Such a conventional learning process costs time and effort.

SUMMARY OF THE INVENTION

It is therefore one of the many objects of the invention to provide a chip design-in aid system and method, which is capable of simplifying the complexity of adjusting and setting parameters, as well as shortening required design-in time of a chip into an application system.

According to embodiments of the present invention, a chip design-in aid system is disclosed. The chip comprises a plurality of chip controlling registers for storing at least one parameter. The system comprises a user interface for inputting user setting data, the user setting data corresponding to at least one function of the chip; a data processing unit for processing the user setting data; and a parameter adjusting unit for receiving the processed user setting data from the data processing unit, and transmitting the processed user setting data to the chip, so as to adjust the parameter stored in the chip controlling registers, whereby the chip is set to perform the function corresponding to the user setting data.

According to embodiments of the invention, a chip design-in aid system is also disclosed. The chip comprises a plurality of chip controlling registers for storing at least one parameter. The system comprises a design-in aid apparatus comprising: a user interface for inputting user setting data, the user setting data corresponding to at least one function of the chip; and a system program for processing the user setting data. The system also comprises a transmission interface coupled to the design-in aid apparatus; and an application system unit comprising: an application system program for receiving the processed user setting data from the system program via the transmission interface; and a function data base for storing at least one moduled function, each moduled function respectively corresponding to the parameter stored in the chip controlling registers. The application system program adjusts the parameter according to the user setting data using the function data base, whereby the chip is set to perform the function corresponding to the user setting data.

According to embodiments of the invention, a design-in aid method for adjusting and setting at least one parameter pertaining to the design-in of a chip is further disclosed. The method comprises the steps of: inputting a user setting data corresponding to at least one function of the chip using a window-based interface; processing the user setting data; and transmitting the processed user setting data to the chip, so as to adjust the parameter, whereby enables the function corresponding to the user setting data.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
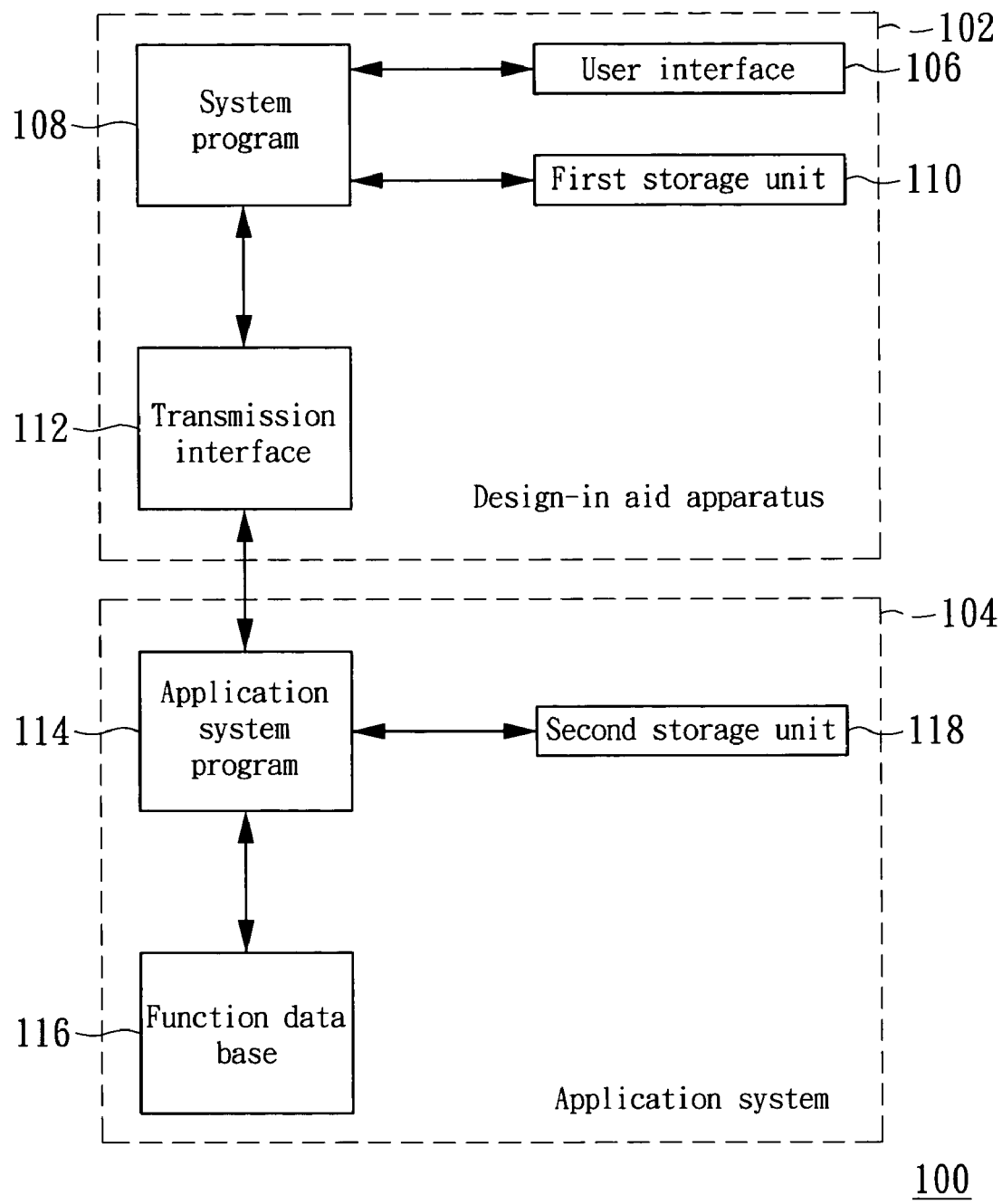
FIG. 1 is a block diagram of a chip design-in aid apparatus according to an embodiment of the present invention.

Please refer to FIG. 1, which shows a block diagram of a chip design-in aid apparatus according to an embodiment of the present invention. A chip design-in aid system 100 comprises the chip design-in aid apparatus 102, which may be a dedicated hardware device, such as a general purpose computer geared with design-in aid software program, and a application system 104, which may be, in this embodiment, a MFP circuit board mounted with a controller chip, but is not limited thereto.

The design-in aid apparatus 102 comprises a user interface 106, a system program 108, a first storage unit 110, and a transmission interface 112. The user interface 106 is used for the convenience of inputting function adjustments and settings. Hereinafter, the data input by users through the user interface 106 is termed user setting data. In this embodiment, the user interface is a window-based program interface, including features such as graphicalized elements, pull-down menus, and selectable entries, etc. Users can therefore utilize inputting tools such as keyboards and/or mouses, to input desired adjustments or settings through simple operations. The system program 108 displays the user interface 106 on a monitor, and controls access to the setting data iput by the users through the user interface 106. In addition, the system program 108 also possesses the function of simulation, which simulates the operation of the application system 104 based on the user input setting data, and displays the simulation results through the user interface 106. By doing so, the users can directly adjust the setting data in light of the simulation results shown by the user interface 106. The first storage unit 110 is used for buffering the user setting data, while the transmission interface 112 for downloading the user setting data to the application system 104, and for receiving data provided by the application system 104.

The application system 104 comprises an application system program 114, a function data base 116, and a second storage unit 118, wherein practically the application program 114 may be executed by dedicated processor or ASIC design. The application system program 114 receives the user setting data transmitted by the transmission interface 112, and stores them in the second storage unit 118. According to the user setting data, the application system program 114 controls the operation of the embedded chip by utilizing the function data base 116, to accomplish the function set by user. The users can also monitor the data within the chip at any point of operation by uploading such data via the transmission interface 112 using the application system program 114, and presenting the data on the user interface 106 using the system program 108. The function data base 116 contains moduled functions pertaining to the adjustments or settings of the application system 104. In this embodiment, the many parameters capable of being adjusted or set in the controller chip are arranged into several moduled functions according to requirements in system developing or testing. Furthermore, these functions respectively correspond to those graphicalized elements, pull-down menus, and selectable entries found in the user interface 106 of the design-in aid apparatus 102. Under such configuration, users can utilize the graficalized elements, menus, and entries of the user interface 106 in setting the application system 104 according to desired functionality, without cultivating user manuals, understanding the nature of each parameter, and setting or adjusting them one by one.

After certain function setting being completed via the user interface 106, corresponding user setting data is stored in the first storage unit 110 of the design-in aid apparatus 102. Such user setting data may not only be downloaded to the application system 104 via the transmission interface 112, upon finishing the design-in process, it may also be programmed to the application system 104, to render an end product.

Figure 2:
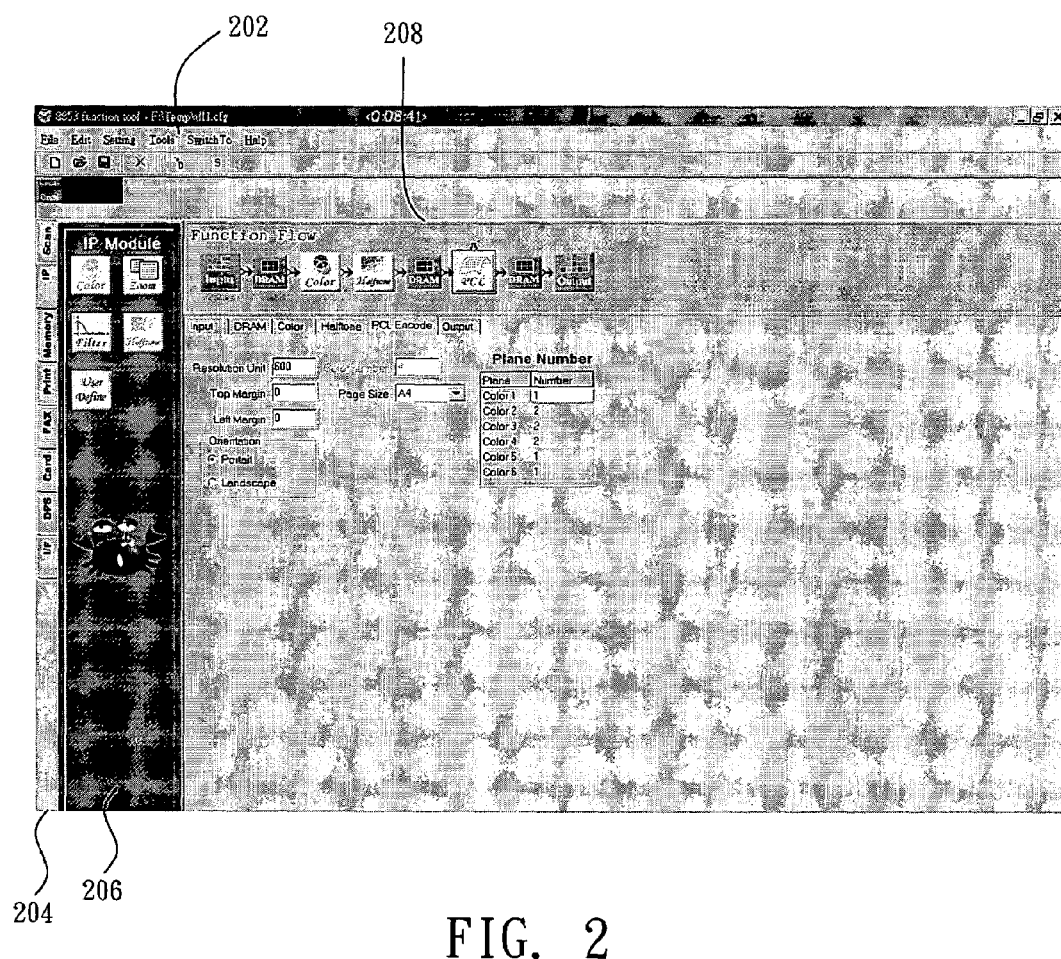
FIG. 2-7 illustrate a user interface of the chip design-in aid apparatus according to an embodiment of the present invention.
Figure 3:
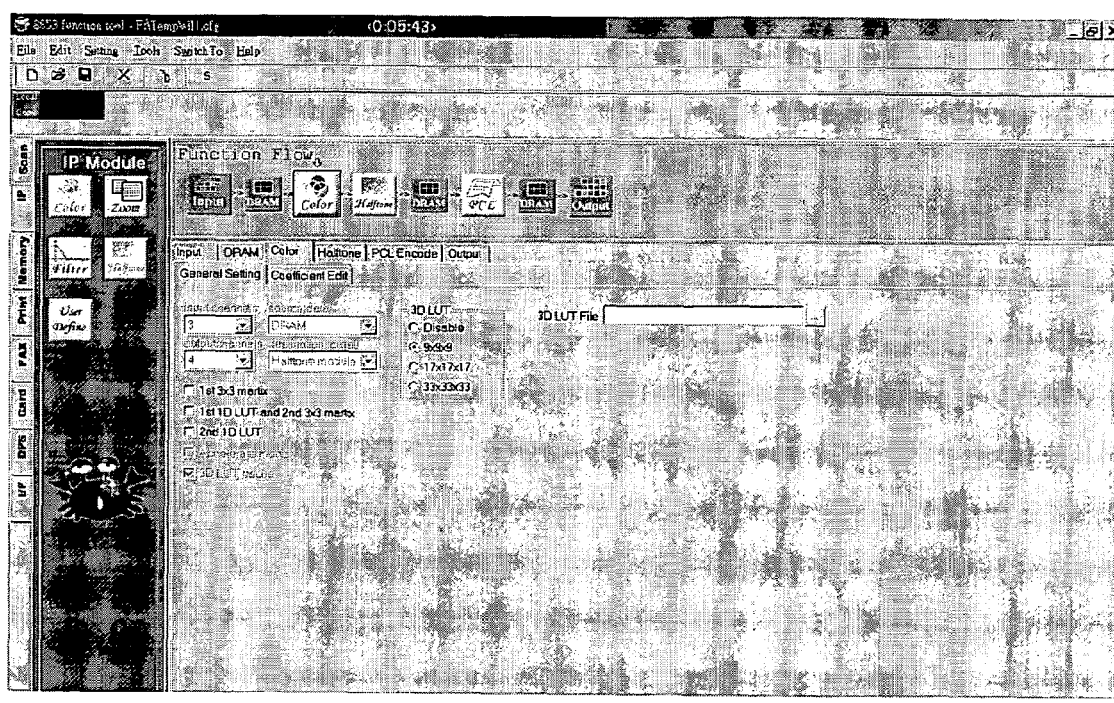
Figure 4:
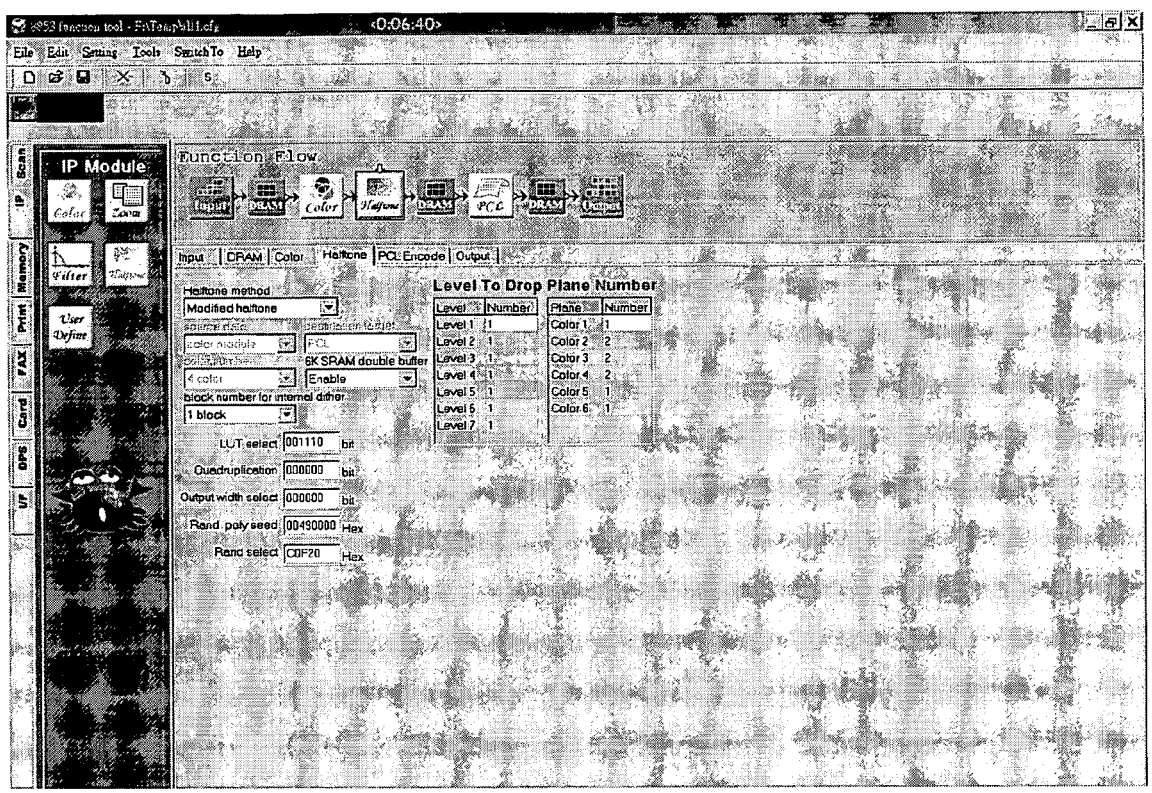
Figure 5:
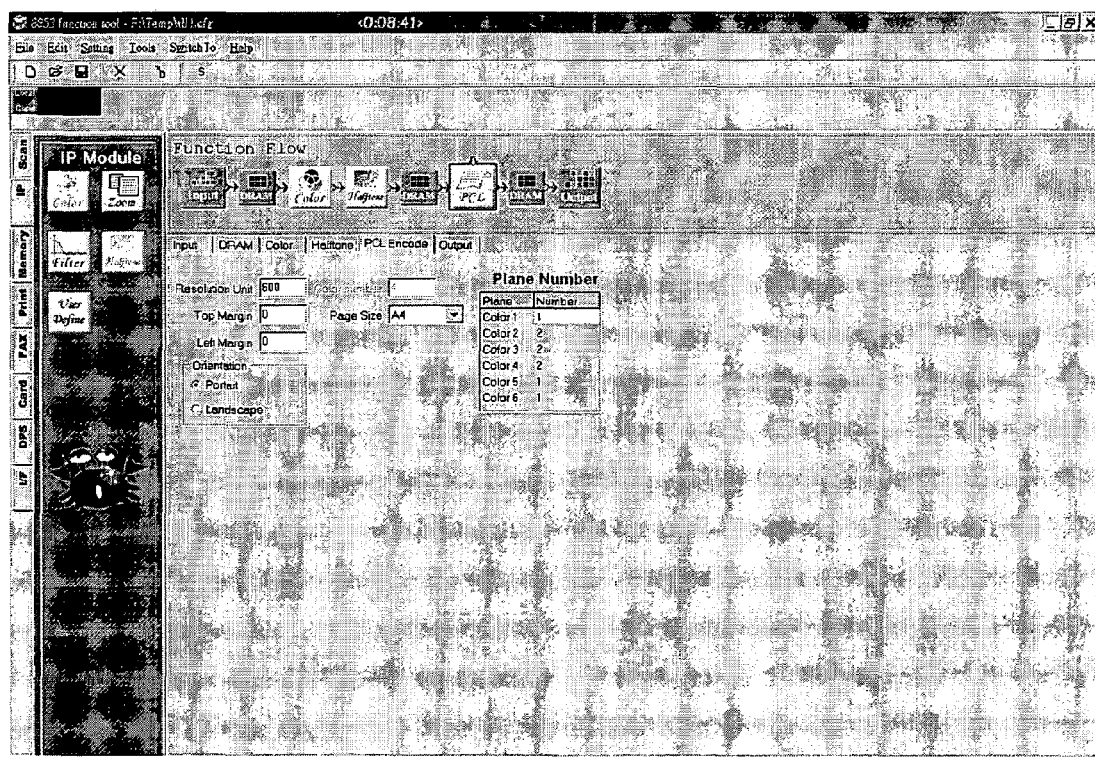
Figure 6:
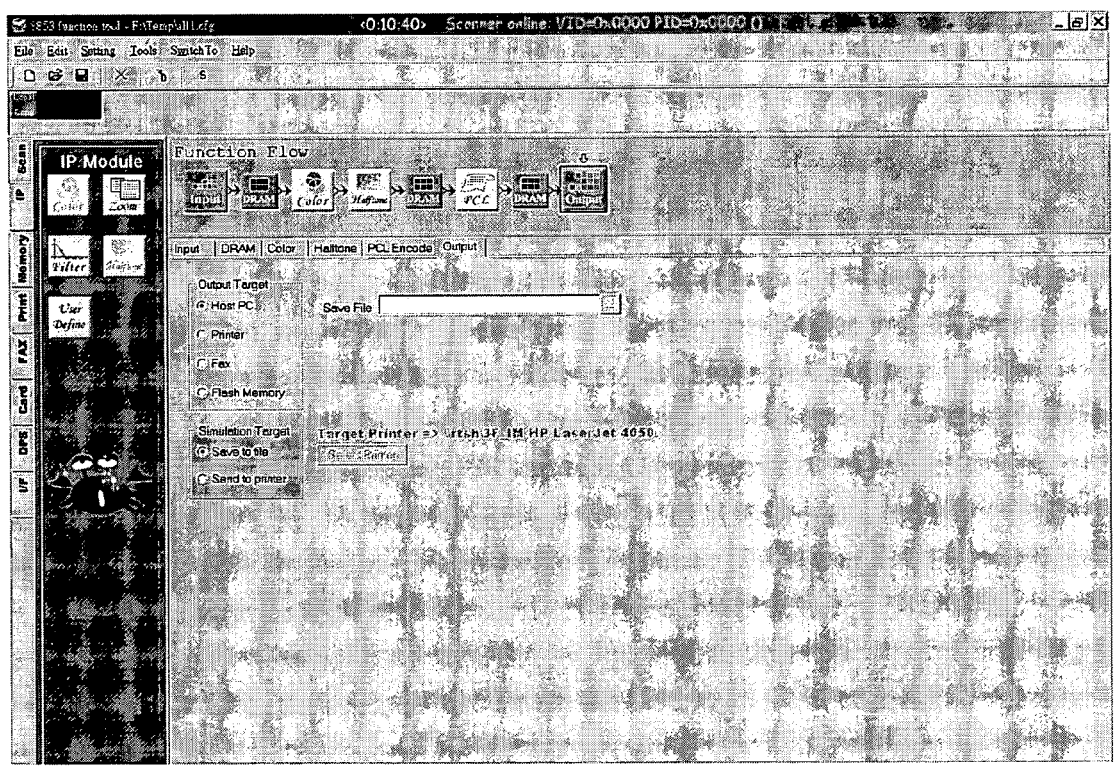
Figure 7:
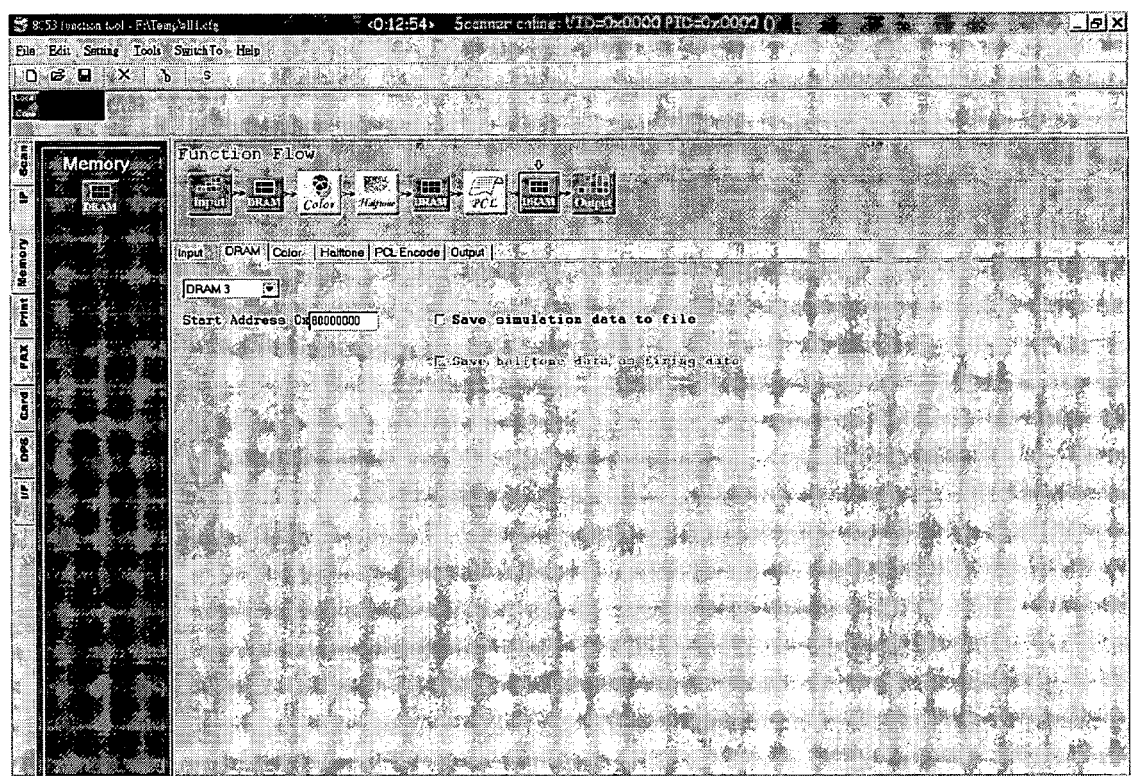

FIG. 2-7 illustrate a user interface of the chip design-in aid apparatus according to an embodiment of the present invention. In this embodiment, controller chips of MFP are taken as an example, but the present invention is not limited thereto. Please refer to FIG. 2, which illustrates an operating window of the user interface in this embodiment. As mentioned earlier, the user interface in this embodiment is a window-based program interface, wherein users can utilize pull-down menus 202, sideway menus 204, graphicalized elements 206, and selectable entries 208, etc, to input desired selecting and setting. In FIG. 2, the pull-down menus 202 cover basic functionalities of a common interface, which are well known to those of ordinary skill in the art, and thus are not detailed hereinafter. As is the case in this embodiment, a typical MFP incorporates the functions of a scanner, a printer, a fax machine, and a card reader, etc. Accordingly, the sideway menus 204 comprise one menu entry for each aforementioned device, labeled: scan, print, fax, card, respectively. Moreover, for each functional component that is common to all these devices, such as: memory, interface (I/F), image processing (IP), etc, a menu entry is also established, and users can choose from these menus according to their needs. For example, when the user selects the image processing (IP) menu, a graphicalized element menu is subsequently shown in the user interface 206. Such a graphicalized element menu includes a plurality of graphicalized elements, which may comprise image processing steps of the MFP such as: color, halftone, zooming, filtering, etc. It is to be noted that these image processing steps respectively correspond to a plurality of controlling registers in the controller chip. In other words, in this embodiment these controlling registers are grouped into a plurality of image processing step modules according to desired image processing functions. Also in this embodiment, the user interface further comprises a function flow entry. The user may select and drag proper graphicalized elements to the function flow in a sorted fashion by mouse, so as to determine the order of function to be executed. In this way, the user can decide after image data being input, the sequence of image processing steps, and then output the processed image data. After the order of a plurality of graphicalized elements being arranged, the user is further required to select or set in the selectable entries 208 of the user interface a plurality of user setting parameters for each graphicalized element, which may include source of image data, file name of image data, length, width, resolution, and color of image data, etc. The user may set these user setting parameters by either selecting from predetermined entries, for example, the source of image data being selected from entries representative of host computer, scanner, memory card, etc, or directly inputting the entry, such as directly inputting the file name of image data. Please note that each user setting parameter may correspond to more than one controlling register of the controller chip.

By implementing the principle of the invention, during design-in phase of a controller chip into an application system, the user may utilize such a chip design-in aid apparatus to master the adjustment and setting of the application system in a rather simple and organized fashion, without engaging extensive trial-and-error process or manual study.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip design-in aid system, the chip comprising a plurality of chip controlling registers for storing at least one parameter, the system comprising:

a user interface for displaying adjustable functions and parameters of the chip and for inputting user setting data, the user setting data corresponding to at least one function of the chip;

a data processing unit for processing the user setting data; and a parameter adjusting unit for receiving the processed user setting data from the data processing unit, and transmitting the processed user setting data to the chip, so as to adjust the parameter stored in the chip controlling registers, and set the chip to perform the function corresponding to the user setting data.

2. The system of claim 1, wherein the user interface is a window-based program interface.

3. The system of claim 1, further comprising a simulation unit for simulating the operation of the parameter adjustment unit according to the user setting data, and outputting a simulation result to the user interface.

4. The system of claim 1, further comprising at least a storage unit for storing the user setting data.

5. The system of claim 1, further comprising a transmission interface for providing communication between the data processing unit and the parameter adjustment unit.

6. The system of claim 1, further comprising a function data base for storing at least one moduled function, each moduled function respectively corresponding to the parameter stored in the chip controlling registers, and the parameter adjustment unit adjusting the parameter according to the user setting data using the function data base.

7. The system of claim 1, wherein the chip is a multiple function peripheral (MFP) controller chip.

8. A chip design-in aid system, the chip comprising a plurality of chip controlling registers for storing at least one parameter, the system comprising:
    a design-in aid apparatus comprising:
    a user interface for displaying adjustable functions and parameters of the chip and for inputting user setting data, the user setting data corresponding to at least one function of the chip; and
    a system program for processing the user setting data;
    a transmission interface coupled to the design-in aid apparatus; and
    an application system unit comprising:
        an application system program for receiving the processed user setting data from the system program via the transmission interface; and
        a function data base for storing at least one moduled function, each moduled function respectively corresponding to the parameter stored in the chip controlling registers;
    wherein the application system program adjusts the parameter according to the user setting data using the function data base so as to set the chip to perform the function corresponding to the user setting data.

9. The system of claim 8, wherein the design-in aid apparatus further comprises a storage unit for storing the user setting data.

10. The system of claim 8, wherein the design-in aid apparatus further comprises a simulation unit for simulating the operation of the application system unit according to the user setting data, and outputting a simulation result to the user interface.

11. The system of claim 8, wherein the application system unit further comprises a storage unit for storing the user setting data.

12. The system of claim 8, wherein the user interface is a window-based interface.

13. The system of claim 12, wherein the window-based interface further comprises graphicalized elements, menus, and entries.

14. The system of claim 8, wherein the chip is a multiple function peripheral (MFP) controller chip.

15. A design-in aid method for adjusting and setting at least one parameter pertaining to the design-in of a chip, the method comprising the steps of:
    displaying adjustable functions and parameters of the chip;
    receiving user setting data corresponding to at least one function of the chip using a window-based interface;
    processing the user setting data; and
    transmitting the processed user setting data to the chip, so as to adjust the parameter and set the chip to perform the function corresponding to the user setting data.

16. The method of claim 15, wherein the at least one parameter is grouped into at least one moduled function according to the corresponding function.

17. The method of claim 16, wherein the window-based interface further comprises at least one graphicalized element, a menu, and an entry, respectively corresponding to the moduled function.

18. The method of claim 17 further comprising inputting the user setting data using the graphicalized element, the menu, and the entry, and adjusting the parameter according to the user setting data using the moduled function.

19. The method of claim 15, wherein the step of processing the user setting data further comprises: simulating the operation of the chip after adjusting the parameter according to the user setting data, and displaying the simulation result in the window-based interface.

20. The method of claim 15 further comprising storing at least one of the user setting data, and selecting the stored user setting data using the window-based interface.

* * * * *